United States Patent
Reis et al.

(10) Patent No.: US 7,420,810 B2
(45) Date of Patent: Sep. 2, 2008

(54) BASE HEAT SPREADER WITH FINS

(75) Inventors: Bradley E. Reis, Westlake, OH (US); Prathib Skandakumaran, Cleveland, OH (US); Martin David Smalc, Parma, OH (US); Gary D. Shives, Brunswick, OH (US); Gary Stephen Kostyak, Brunswick, OH (US); Julian Norley, Chagrin Falls, OH (US)

(73) Assignee: GrafTech International Holdings, Inc., Parma, OH (US)

( * ) Notice: Subject to any disclaimer, the term of this patent is extended or adjusted under 35 U.S.C. 154(b) by 126 days.

(21) Appl. No.: 11/531,171

(22) Filed: Sep. 12, 2006

(65) Prior Publication Data

US 2008/0062651 A1    Mar. 13, 2008

(51) Int. Cl.
*H05K 7/20* (2006.01)
*H01L 23/36* (2006.01)

(52) U.S. Cl. ............ 361/707; 361/699; 361/700; 361/701; 361/704; 361/710; 165/80.3; 165/104.26; 165/185; 257/713; 257/714; 257/715

(58) Field of Classification Search ........... 361/687, 361/690, 692, 699–701, 704–710, 715, 719; 165/80.3, 80.4, 80.5, 104.21, 104.26, 104.33, 165/185; 257/713–715, 722; 29/890.03, 29/890.032; 174/15.1, 16.3, 252
See application file for complete search history.

(56) References Cited

U.S. PATENT DOCUMENTS

| | | | | |
|---|---|---|---|---|
| 3,404,061 A | | 10/1968 | Shane et al. ............ 161/125 |
| 4,883,116 A | * | 11/1989 | Seidenberg et al. .... 165/104.26 |
| 4,893,116 A | * | 1/1990 | Henderson et al. ......... 345/592 |
| 4,895,713 A | | 1/1990 | Greinke et al. ............ 423/448 |
| 5,314,011 A | * | 5/1994 | Leidinger et al. ...... 165/104.26 |
| 5,360,058 A | * | 11/1994 | Koeppl et al. ............... 165/274 |
| 5,386,143 A | * | 1/1995 | Fitch ........................... 257/715 |
| 5,406,698 A | | 4/1995 | Lipinski ....................... 29/727 |
| 5,642,776 A | | 7/1997 | Meyer, IV et al. ....... 165/104.3 |
| 5,902,762 A | | 5/1999 | Mercuri et al. ................ 501/99 |
| 6,062,302 A | * | 5/2000 | Davis et al. ............ 165/104.26 |
| 6,237,223 B1 | * | 5/2001 | McCullough .......... 29/890.032 |
| 6,308,772 B1 | * | 10/2001 | Obara et al. ................ 165/80.3 |
| 6,334,480 B1 | | 1/2002 | Lim et al. .................. 165/80.3 |
| 6,382,309 B1 | | 5/2002 | Kroliczek et al. ........ 165/104.3 |
| 6,410,982 B1 | * | 6/2002 | Brownell et al. ............. 257/714 |
| 6,447,692 B1 | * | 9/2002 | Momoda et al. ............... 252/70 |
| 6,478,997 B2 | * | 11/2002 | McCullough ................ 264/108 |
| 6,613,252 B2 | | 9/2003 | Norley et al. ............... 264/37.1 |
| 6,698,502 B1 | | 3/2004 | Lee .......................... 165/104.3 |
| 6,758,262 B2 | * | 7/2004 | Kawabata et al. .......... 165/80.3 |
| 6,843,307 B2 | * | 1/2005 | Yuyama et al. ........ 165/104.26 |
| 6,883,337 B2 | | 4/2005 | Shyy et al. .................... 62/115 |
| 6,886,249 B2 | * | 5/2005 | Smalc ...................... 29/890.03 |
| 6,899,165 B1 | * | 5/2005 | Wu ........................ 165/104.26 |

(Continued)

FOREIGN PATENT DOCUMENTS

JP          356094190 A  *  7/1981

(Continued)

*Primary Examiner*—Michael V Datskovskiy
(74) *Attorney, Agent, or Firm*—James R. Cartiglia; Waddey & Patterson, PC

(57) ABSTRACT

A thermal management device for the removal of thermal energy useful for, inter alia, electronic devices or other components.

30 Claims, 7 Drawing Sheets

U.S. PATENT DOCUMENTS

| | | | |
|---|---|---|---|
| 6,988,315 B2 | 1/2006 | Parish, IV et al. | 29/890.045 |
| 7,188,661 B2 * | 3/2007 | Mathews et al. | 165/80.3 |
| 7,213,637 B2 * | 5/2007 | Lin et al. | 165/104.26 |
| 7,254,888 B2 * | 8/2007 | Chu et al. | 29/840 |
| 7,286,352 B2 * | 10/2007 | Curtis et al. | 361/697 |
| 2001/0001898 A1* | 5/2001 | Lee et al. | 29/890.03 |
| 2002/0021556 A1* | 2/2002 | Dibene et al. | 361/704 |
| 2002/0118511 A1* | 8/2002 | Dujari et al. | 361/703 |
| 2004/0190253 A1* | 9/2004 | Prasher et al. | 361/699 |
| 2005/0056808 A1* | 3/2005 | Leu et al. | 252/71 |
| 2005/0199376 A1* | 9/2005 | Lee | 165/104.26 |
| 2006/0196640 A1* | 9/2006 | Siu | 165/104.26 |
| 2006/0230615 A1* | 10/2006 | Lin et al. | 29/890.05 |
| 2006/0237167 A1* | 10/2006 | Lee | 165/104.26 |
| 2007/0012429 A1* | 1/2007 | Siu | 165/104.33 |
| 2007/0025085 A1* | 2/2007 | Chang | 361/704 |
| 2007/0044308 A1* | 3/2007 | Chen | 29/890.032 |
| 2007/0102147 A1* | 5/2007 | Chang | 165/185 |
| 2007/0230128 A1* | 10/2007 | Kim et al. | 361/699 |
| 2007/0258213 A1* | 11/2007 | Chen et al. | 361/701 |

FOREIGN PATENT DOCUMENTS

| | | | |
|---|---|---|---|
| JP | 02000150749 A | * | 5/2000 |
| JP | 2002190561 A | * | 7/2002 |

* cited by examiner

BASE HEAT SPREADER WITH FINS

BACKGROUND OF THE INVENTION

1. Technical Field

The present invention relates to a thermal management device useful for applications including cooling electronic components. More particularly, the present invention relates to a base heat spreader with a plurality of fins with improved characteristics for dissipating heat from electronic components such as semiconductor chips so that the components are reduced to a lower temperature state. The invention also includes a novel method for the removal of heat from components including electronic devices of a relatively small size.

2. Background Art

With the advancement of electronic devices being produced in increasingly smaller and smaller sizes coupled with the integration of multiple components into a single unit, cooling electronic devices have become a substantial industry. Specifically, in devices such as central processing units (CPUs) which contain integrated circuit-type electronics, the unit itself contains multiple components which produce heat and the performance of a CPU itself decreases unless sufficient thermal energy is removed from the unit. Semiconductors also suffer in that their performance deteriorates when the operating temperature increases to an undesired level around the semiconductor device.

The traditional method of cooling an electronic device is by using a fan to circulate air around the electronic device, and thus remove thermal energy. Unfortunately, the problems associated with fan-type technology are multiple, including a relatively low cooling efficiency, a bulky power source and a limited functional size. Furthermore, with the growing trend of devices which use electronic components becoming smaller and smaller, traditional cooling methods, including fans, are becoming much more limited as both a decrease in size and decrease in the acceptable weight of thermal management systems are necessitated by the industry. However, methods have developed to replace fan-type cooling devices which are both smaller and located in the immediate vicinity of the electronic device needing to be cooled. One purpose of the present invention is to provide a heat management device which can eliminate the use of fans, but more generally, it is to provide a more efficient heat sink for use in situations where heat sink performance is limited by convection from the fins themselves, allowing reduction of airflow requirements or lower thermal resistance for a given airflow.

One such type device is a heat pipe which has been demonstrated to remove heat from semiconductor chips. For example, Kroliczek, U.S. Pat. No. 6,382,309, discloses a loop heat pipe incorporating an liquid transfer medium having a wick that is liquid superheat tolerant and resistant to back conduction. The liquid heat pipe as disclosed in the '309 patent is a two-phase heat transfer system which includes a continuous loop in which both vapor and liquid always flow in the same direction. The device functions as to absorb heat through the evaporation of a liquid working fluid at an liquid transfer medium section of the liquid heat pipe and then, transports the vaporized fluid to a condenser section wherein the vaporized fluid is condensed. Furthermore, the use of a heat pipe as described in the '309 patent describes the latent heat of vaporization/condensation working fluid which allows for the transfer of relatively large quantities of thermal energy with small amounts of fluid and negligible temperature drops. Additionally, the '309 patent incorporates an improved wick which is resistant to back-conduction of heat energy, a problem associated with many traditional loop heat-type devices.

In Myer IV et al. (U.S. Pat. No. 5,642,776), an insulated heat pipe is claimed which includes a simple foil envelope. The patent claims metal foil sheets which are sealed at corresponding edges to encompass a wick comprised of a semi-rigid sheet of plastic foam including channels cut into the surface of the wick. Furthermore, the disclosed coolant for use in the loop heat pipe is water.

Other designs of thermal management systems have been developed to remove heat from small electronic devices, specifically devices for use in both computers and other high-end microelectronics.

In U.S. Pat. No. 6,988,315, Parish IV et al. describe a cooling apparatus having low profile extrusions and a method of manufacturing the cooling device. The patented invention is a device for circulating a heat transfer fluid including means for removing heat from the heat-transfer fluid. Furthermore, the Parish et al. patent is intended to be used to remove heat in applications including printed circuit boards of electronic components and also for use as general heat exchangers in applications where space is limited weight is critical.

Lim et al., U.S. Pat. No. 6,334,480, discloses a cooling device with micro-cooling fins. The patent claims a cooling device with micro-cooling fins which have an efficient heat-releasing structure. Essentially, the efficient heat-releasing structure includes a plurality of vibrating-type cooling fins extending above the heat exchanging device wherein the vibrating fins reduces the air space accumulated in a heat boundary layer which can hamper the performance of traditional cooling fins. Additionally, this patent claims that the use of the vibrating fins allows for an increased efficiency of removal of thermal energy while allowing for the invention to be used in increasingly smaller electronic devices.

U.S. Pat. No. 6,883,337 issued to Shyy et al., claims a thermal management device comprising a vapor compression cycle heat transfer device with a drop-wise condenser. Allegedly, the device is highly energy efficient and can be connected with similar type structures to form a row of thermal management devices for incorporation within small electronic devices such as chip packages. Additionally, the patent claims that the device is gravity insensitive and can provide a relatively high cooling rate for electronic instruments while being scaled to accommodate different types of applications.

In Lee (U.S. Pat. No. 6,698,502), a micro-cooling device is disclosed as having a high cooling efficiency which is neither influenced by gravity nor restricted in the position of installation. The device includes the coolant being stored inside a chamber, and also a heat-absorbing part wherein the liquid coolant can be vaporized to gaseous coolant for the transfer of thermal energy from the electronic device. The invention further includes interior micro channels which are designed so that the fluid coolant may move through capillary force and thus, not be constricted by limitations due to gravity. Additionally, the Lee patent claims that the circulation of the coolant in the cooling device is carried out without external driving forces, and instead is through the capillary phenomenon of surface tension of the liquid coolant within the invention. One method of inducing this capillary action is by use of a thin metal screen mesh providing for micro channels for the passage of the liquid coolant within the system.

Unfortunately, heat transfer devices produced by the prior art processes do not provide sufficient heat dissipation for many applications, or require extensive processing cost to construct the thermal management device. In addition, some of the aforementioned devices can be prone to failure, thus leading to excessive heat as heat transfer is significantly diminished.

In International Application No. WO 2006/073269, a heat transfer device and manufacturing methods thereof using a hydrophilic wick are disclosed. This device precludes many of the aforementioned problems of the loop heat pipes and chambers utilizing capillary action by incorporating a device with both the hydrophilic wick and a support structure. The device is intended to be a flat panel device using a water coolant which efficiently eliminates the possibility of drying out while also providing efficient cooling through the vaporization and condensation of the water coolant.

One disadvantage of the device of International Application No. WO 2006/073269 is that its design is for a flat panel heat exchanging device and does not incorporate the use of fins which can significantly improve the performance of the device. Furthermore, the device does not include sufficient methods to reduce localized hot spots produced by an electronic device and does not adequately transfer thermal energy along the device's entire surface.

An additional method of managing thermal energy is through graphite-based components which offer thermal conductivity comparable with or better than copper or aluminum but at a fraction of the weight while providing significantly greater design flexibility. Graphite-based thermal management products take advantage of the highly directional properties of graphite to move heat away from electronic components while having thermal conductivities substantially higher than typical aluminum alloys used for heat management. Furthermore, graphite is anisotropic making it more suitable for channeling heat in a preferred direction.

What is desired, therefore, is an improved thermal management device for use with a wide variety of electronic devices including electronic devices of an extremely small size wherein the thermal management device has improved properties. Furthermore, what is desired is heat sink with improved efficiency for use when the dissipation of thermal energy is limited by convection, where the heat sink will allow for more efficient forced convection, including a lowering of the thermal resistance for a given airflow and possibly the elimination of fan-type components. Indeed, a combination of characteristics including the reduction of localized hot spots of thermal energy and the relatively even spreading of thermal energy coupled with the ability to be gravity insensitive while providing sufficient cooling have been found to be needed for use of thermal management devices in small scale electronic devices. Also desired is a method which is improved for removing heat from electronic devices.

SUMMARY OF THE INVENTION

The present invention provides a heat management device which is uniquely capable of use in applications of removing thermal energy from electronic devices wherein space is limited as well as the design orientation. The inventive heat management device provides for the reduction of localized hot spots of thermal energy as well as the even dissipation of thermal energy from the electronic device while providing a combination of improved thermal energy removal with relatively lightweight design characteristics not heretofore seen. In addition, a base heat spreader which receives heat from the electronic device combined with at least one and preferably a plurality of fins having an internal coolant provide a heat management device which can be designed for use in a variety of circumstances including multiple orientations of the heat management device as well as the ability to use the heat management device in machines in a variety of different configurations.

The term "fins" as used herein, refers to structures which function to increase the effective surface area of a thermal management device, such as a heat sink, in order to improve the heat dissipation characteristics of the device, and constitute elements extending from a surface of a thermal management device such that contact between a fin and other elements of the device is at a discrete location on the fin, such that the fin is exposed to the air on all surfaces other than the discrete location at which it contacts other elements of the thermal management device. Most commonly, fins extend perpendicularly from a heat sink base.

More particularly, the inventive heat management device has a base spreader which receives heat from the electronic device and transports the heat into a plurality of fins in communication with the base heat spreader. An important characteristic for the base heat spreader is not only sufficient thermal conductivity so that heat is received from the electronic device into the base heat spreader but also so that the base heat spreader evenly distributes thermal energy from the electronic device into the plurality fins so as to promote an improved efficiency in removing thermal energy.

The heat management device of the present invention reduces the required airflow necessary for cooling electrical components through forced convection by lowering the overall thermal resistance; indeed, it can also eliminate the use of fans in certain applications by improving the local convection heat flux in free convection. More specifically, the inventive thermal management device facilitates better heat transfer at the solid-air interface which typically represents the greatest barrier in improving the dissipation of thermal energy.

The inventive heat management device should have a relatively uniform contact surface with each individual fin of the plurality of fins attached to the base heat spreader. Additionally, the base heat spreader should be in communication with the plurality of fins so that the thermal energy received in the base heat spreader is transferred into the plurality of fins so that the fins may dissipate the heat received in the base heat spreader from the electronic device. Furthermore, the base heat spreader may include indentations or designed configurations so that the individual fins of the plurality of fins fit into grooves so as to improve communication of thermal energy from the base heat spreader into each individual fin.

The invention may also include a method of attaching each individual fin at the desired location on the base heat spreader of the thermal management device. It has been found highly advantageous to use solder, swaging, or mechanical attachments methods such as compression (for instance, through the use of screws that can pinch fins) so that there is efficient communication of thermal energy from the base heat spreader into each individual fin of the plurality of fins on the surface of the base heat spreader.

In an additional embodiment, epoxy, especially a thermal epoxy, may be used to secure the plurality of fins to the base heat spreader. The epoxy may be applied in multiple configurations on the thermal management device, including along the side and bottom of each fin so that the edge of the fin is still in constant communication with the base heat spreader as well as on the entire contact portion of the fin, so that in each configuration the thermal epoxy provides support on the to the fins wherein the fins contact the base heat spreader at perpendicular angles.

Each fin on the surface of the base heat spreader includes a housing which encloses an inner area within the fin. Placed within the inner area of the housing of the fin is a working fluid which cycles between liquid and vapor phase. Furthermore, a liquid transfer medium, preferably a wick with a high wettability, can be within the inner area of the fin specifically in a location so as to be most near the edge of the fin in communication with the base heat spreader. The liquid transfer medium contains a substantial portion of the liquid working fluid thereby keeping the liquid working fluid in close proximity to the base heat spreader device of the thermal management device.

Advantageously, upon sufficient thermal energy, the liquid working fluid contained within the liquid transfer medium converts to vapor and migrates to a lower temperature region of the fin. Following, the vapor condenses within the lower temperature region of the fin and flows back to the liquid transfer medium due to capillary force, gravity or both.

Alternatively, gravity can be used for return flow of the liquid working fluid high temperature region of the fin, thereby eliminating the need for a wick or other liquid transfer medium.

An object of the invention, therefore, is a heat management device having characteristics which enable it to be employed in a wide variety of electronic device applications.

Another object of the invention is a heat management device with a base heat spreader which minimizes localized high-intensity thermal energy spots while also spreading the thermal energy relatively evenly among a plurality of fins.

Still another object of the invention is a heat management device having a plurality of fins in communication with a base heat spreader to provide for the dissipation of thermal energy received in the base heat spreader from the electronic device.

Yet another object of the invention is a heat management device which includes a plurality of fins where each fin includes working fluid, preferably with a liquid transfer medium, which utilizes the latent heat of vaporization of the working fluid to remove heat from the base heat spreader received from the electronic device.

Another object of the invention is the method of removing heat from an electronic device utilizing a base heat spreader with a plurality of fins including a liquid transfer medium with good wettability characteristics and working fluid.

These aspects and other that will become apparent to the artisan upon review of the following description can be accomplished by providing a base heat spreader formed of a material providing for the reduction of localized high intensity thermal energy locations as well as substantially spreading the thermal energy to a plurality of fins for dissipation from the electronic device. The inventive heat management device advantageously incorporates fins having a working fluid therein, which utilizes the conversion of the working fluid from liquid phase into vapor phase and back to remove thermal energy from an electronic device and substantially lower the operating temperature of the electronic device.

Preferably, each fin contains a liquid transfer medium with a high wettability which holds a substantial portion of the liquid working fluid within the liquid transfer medium and in close proximity to the edge of the fins in communication with the base heat spreader. Advantageously, a portion of the liquid working fluid converts to vapor upon sufficient thermal energy received from the base heat spreader and flows as vapor to a lower temperature region of the fin.

The vapor phase working fluid condenses at the lower temperature region and flows through capillary force back to the liquid transfer medium wherein the liquid working fluid can absorb more thermal energy and repeat the cycle.

The inventive heat management device includes the novel method of absorbing thermal energy into a base heat spreader to sufficiently spread the thermal energy relatively evenly among a plurality of fins wherein the fins containing a working fluid which dissipates the thermal energy by means of a cycle of converting the liquid working fluid into vapor and back.

It is to be understood that both the forgoing general description and the following detailed description provide embodiments of the invention and are intended to provide an overview of the framework of understanding to nature and character of the invention as it is claimed.

DETAILED DESCRIPTION OF THE PREFERRED EMBODIMENT

The thermal management device in accordance with the present invention can improve both the performance and functional lifespan of an electronic device through the reduction of the operating temperature of the device. Specifically, the invention provides for greater reduction in the temperature of the electronic device than prior art devices through improved convection, namely the transfer of thermal energy from the inventive thermal management device to the surrounding air.

In configurations including the use of a fan component, forced convection occurs as the fan imposes external motion onto the air. Forced convection provides for typically better cooling as air is continuously in motion over the heat sink and provides a larger gradient of temperatures resulting in a larger thermal flux. With the improved thermal dissipation qualities of the present invention, less airflow is necessary as the thermal management device is more efficient for a given airflow. As such, the fan components may be designed smaller, or eliminated altogether, resulting in a saving of space as well as electrical energy.

In instances of free convection, where the motion of the surrounding air occurs only from the density gradient of the air and not from external components, the thermal management device provides for a greater heat transfer across the solid to fluid interface resulting in a lower operating temperature of the electronic device. Despite free convection being less efficient than forced convection, design requirements often preclude the addition of fans as space is often limited. As such, the lower thermal resistance of the present invention is ideal as the thermal management device still dissipates heat efficiently from the electronic device providing for a lower operating temperature.

Figure 1:
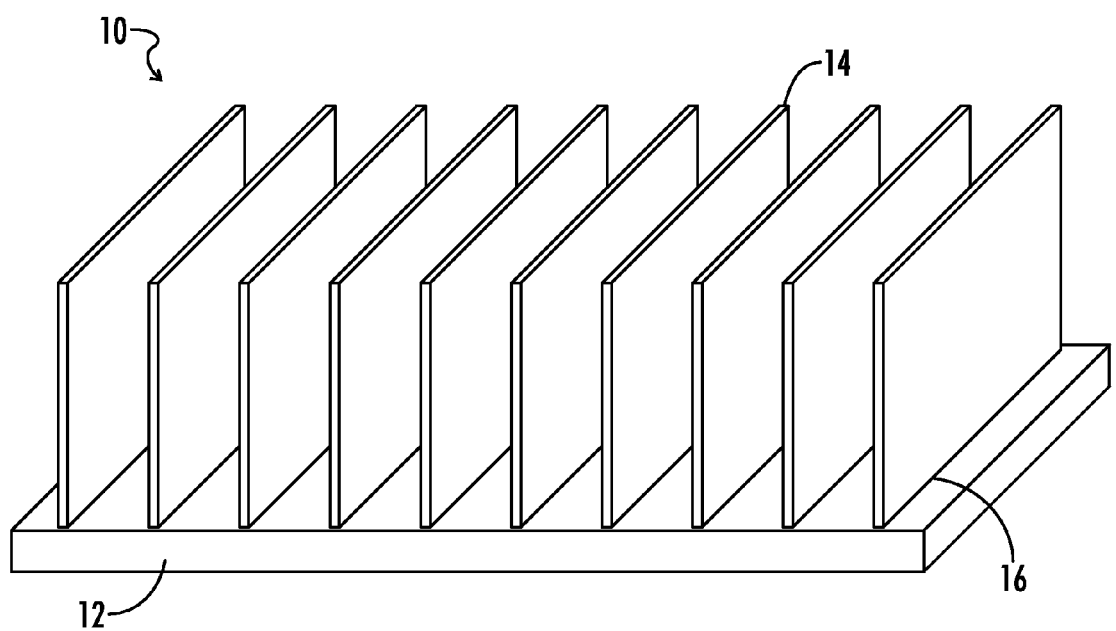
FIG. 1 is a schematic illustration of a general embodiment of the present invention.

The thermal management device in accordance with the present invention is prepared with two essential components. The device includes a base heat spreader which is adjacent to the electronic device providing the thermal energy, and also at least one fin and preferably a plurality of fins, in contact with the base heat spreader. FIG. 1 is a schematic illustration of one embodiment of the present invention with the plurality of fins of the invention adjacent to an electronic device which emits thermal energy. Thermal management device 10 includes base heat spreader 12 which is in contact with the electronic device which is to be cooled. Thermal management device 10 also includes plurality of fins 14 which are on the opposite surface of base heat spreader 12 from the electronic device which is to be cooled (although fins 14 can be located on any surface of base heat spreader 12 from which heat dissipation is desired). The fins 14 can be attached to base heat spreader 12 by a variety of methods, including soldering, swaging and mechanical attachments 16; alternatively, thermal epoxy may be utilized to adhere each fin of plurality of fins 14 to base heat spreader 12 for the subsequent dissipation of thermal energy from the heat generating electronic device. The electronic device may be a printed circuit board or other electronic devices including a computer, cell phone, PDA, or other electronic equipment. More particularly, the thermal management device maybe used in applications where excessive thermal energy can be diminish the performance characteristics of an electronic device, such as applications including but not limited to servers, computer processing units, graphic-processors and the like. Furthermore, due to the continual decrease in size of electronic devices, the heat management device 10 may be located in a variety of configurations and sizes pertinent to the electronic device.

Figure 2:
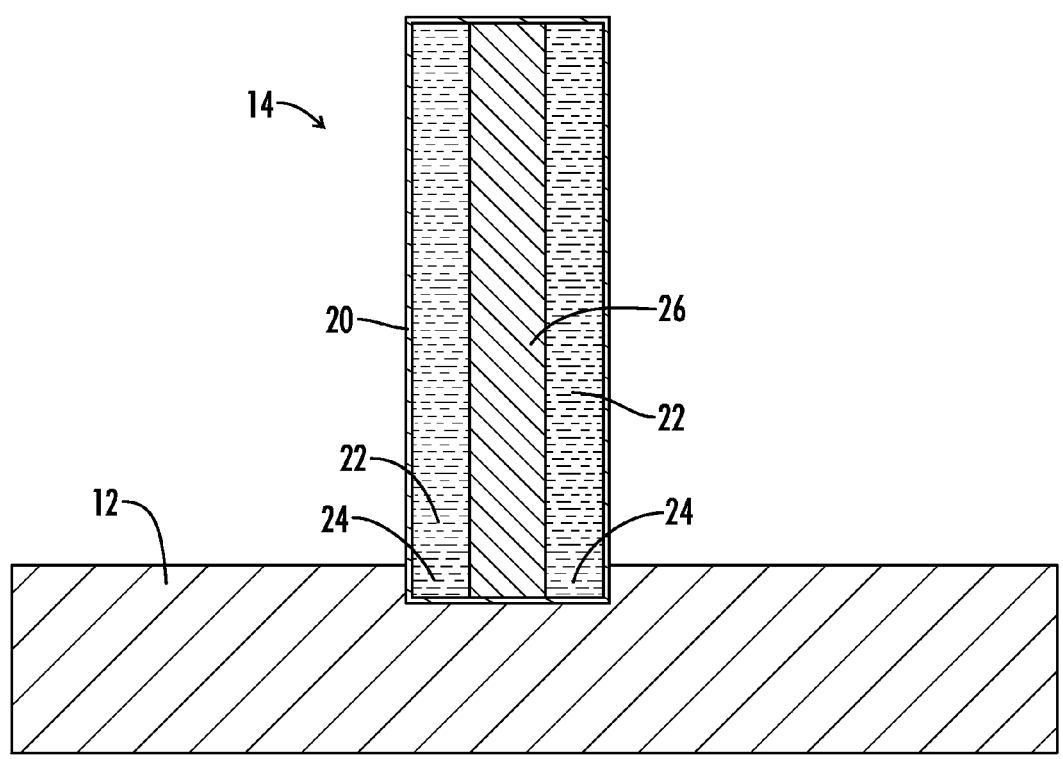
FIG. 2 is a schematic illustration of a cross-section view of a preferred embodiment of a fin design of the present invention.
Figure 2A:
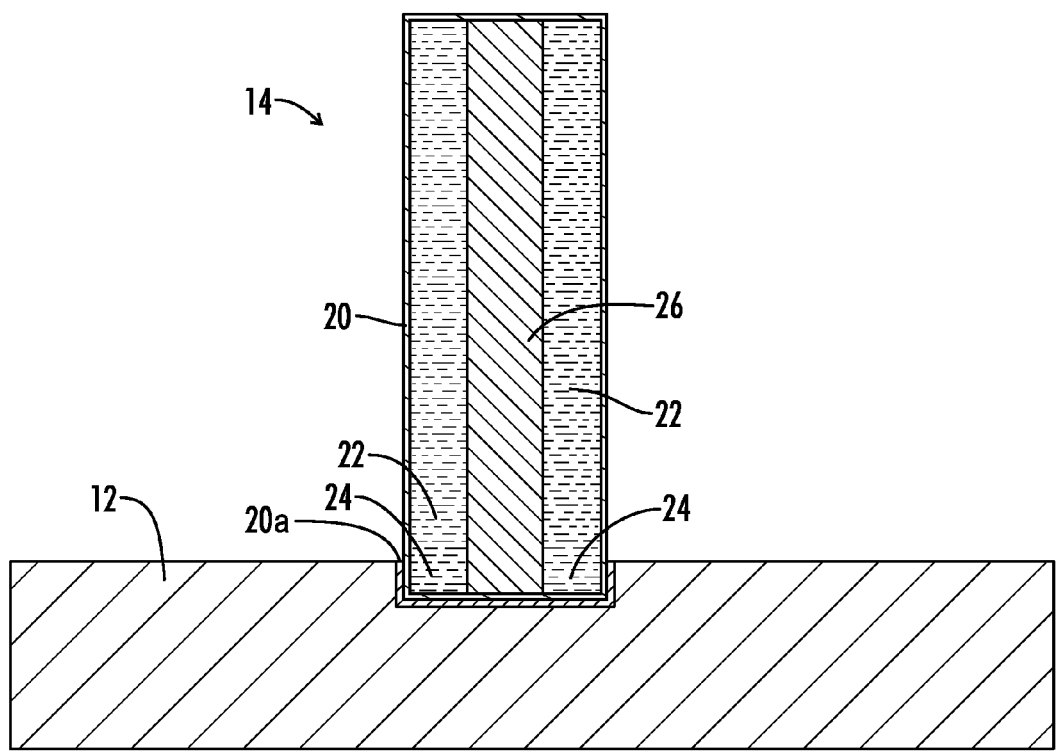
Figure 2B:
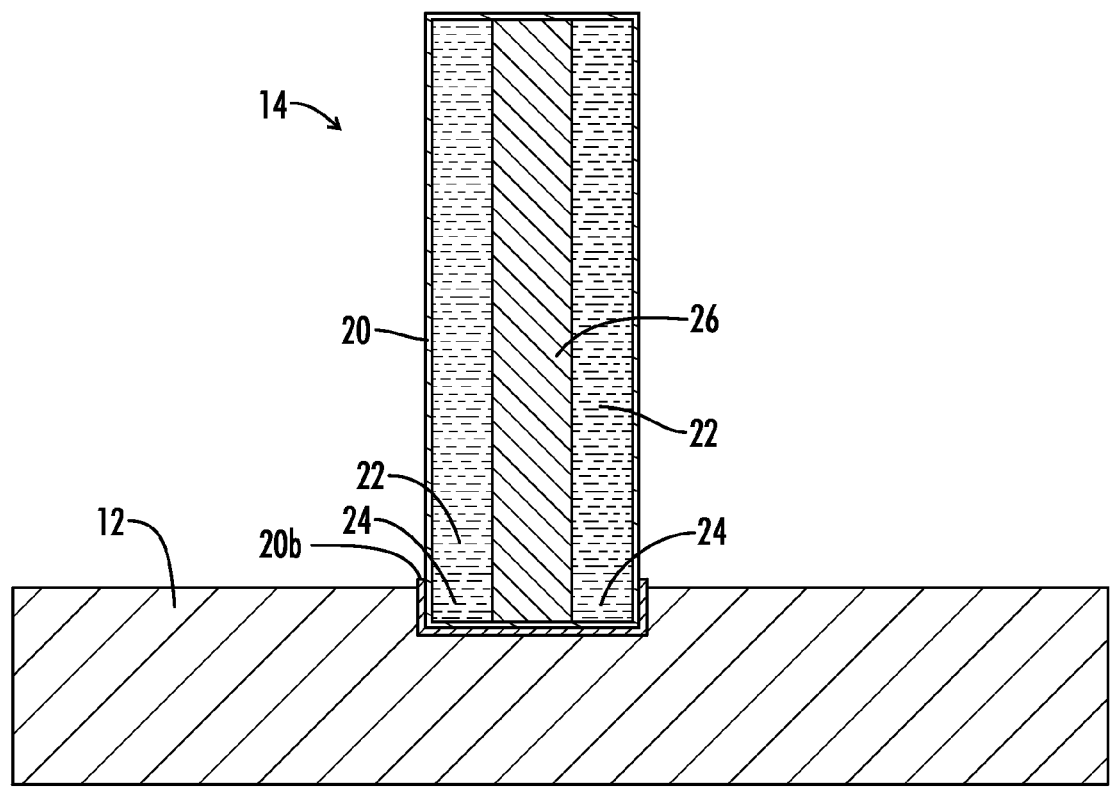
Figure 2C:
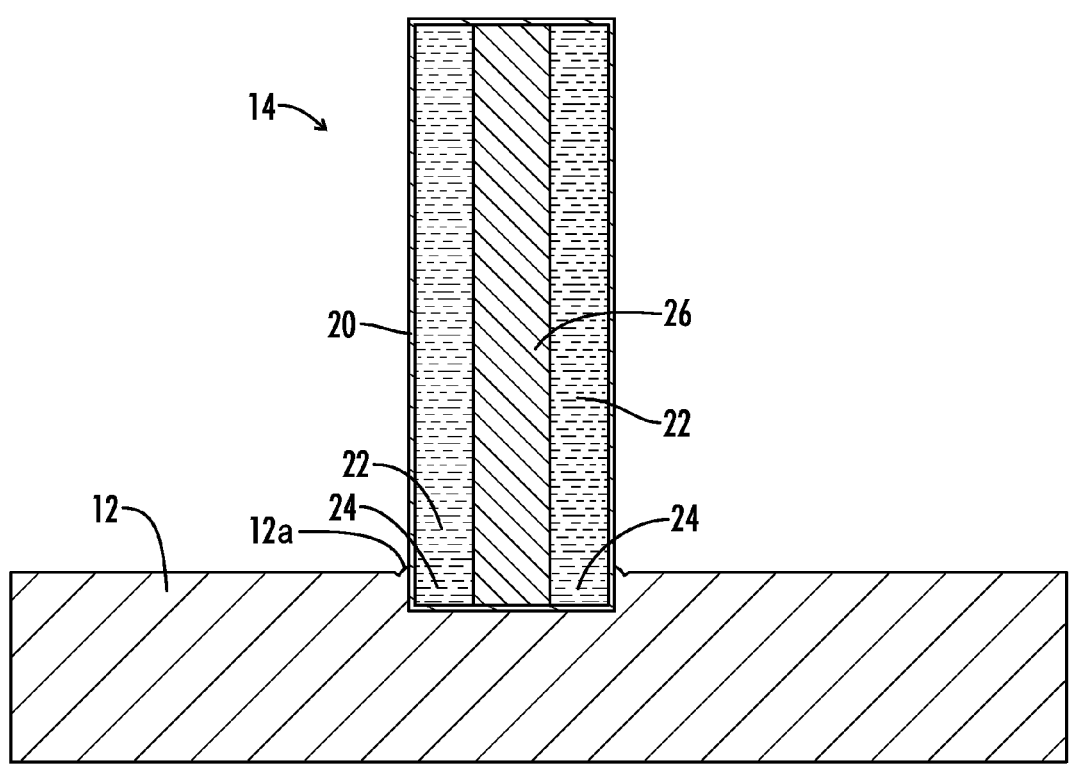

FIG. 2 is a schematic illustration of the thermal management device of a preferred embodiment of the present invention illustrating the interior arrangement of fin 14. In FIG. 2, support structure 26 is disposed between two portions of liquid transfer medium 22 and functions as a vapor spacer between the two portions of liquid transfer medium 22. Both portions of liquid transfer medium 22 as well as support structure 26 extend a substantial portion of the length of fin 14, with liquid transfer medium 22 in contact with the walls of housing 28 and support structure 22. Further embodiments of the fin design can include the liquid transfer medium on only one side of the support structure and can include liquid transfer mediums comprised of but not limited to wicks, grooved foam, or sintered copper structures. Moreover, the internal spaces of fin 14 are preferably under vacuum, to facilitate vapor flow therein.

Figure 3A:
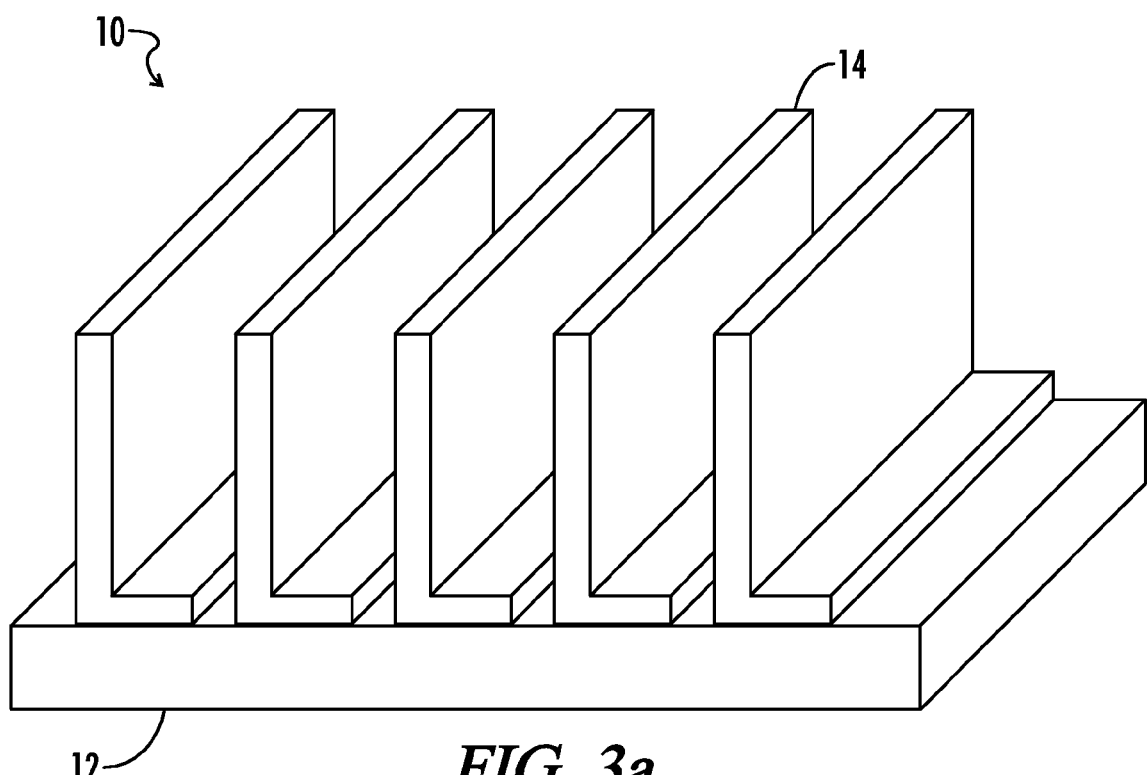
FIG. 3a is a schematic illustration of a cross-section of one embodiment of fins attached through an "L"-shaped mechanical fit.
Figure 3B:
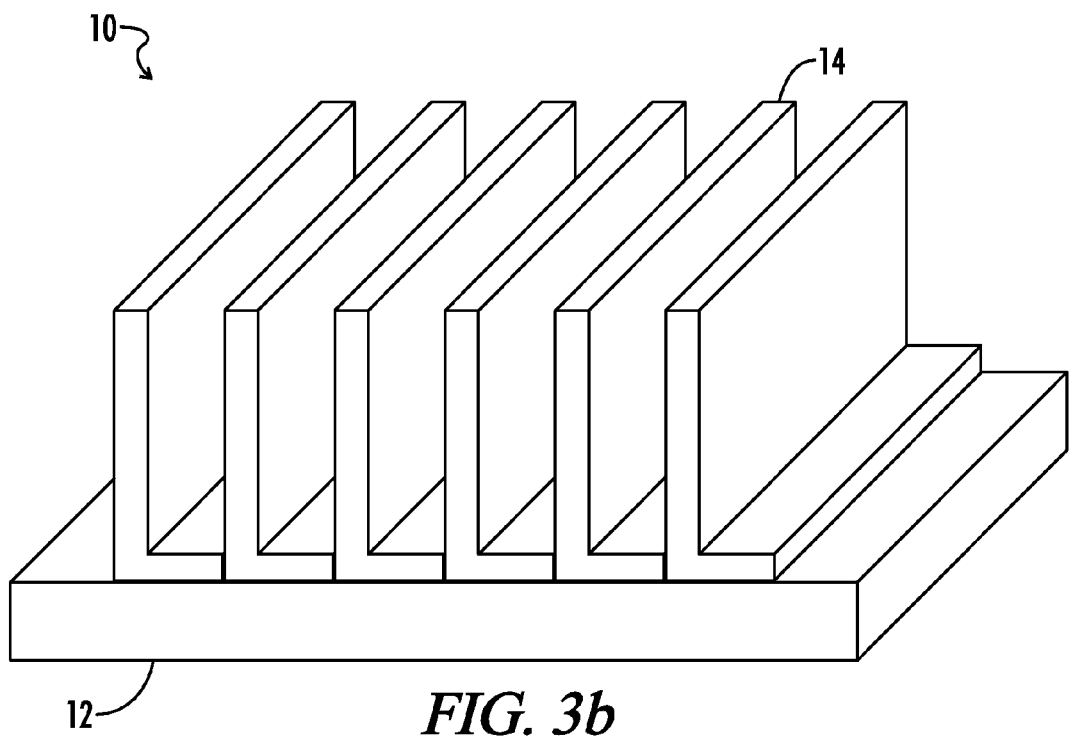
FIG. 3b is a schematic illustration of a cross-section of another embodiment of fins attached through an "L"-shaped mechanical fit.

FIGS. 3a and 3b illustrate a cutaway view of the fins which mechanically attach to the surface of the base heat spreader. Specifically, the base of each fin of the plurality of fins has an L-shape which can be adhered or otherwise attached to the surface of the base heat spreader for a secure attachment. Furthermore, the fins may be positioned so that each fin is spaced a desired distance from the next fin so that an even distribution of fins occurs on the top surface of the base heat spreader, as shown in FIG. 3a; contrariwise, the fins can be spaced such that the fin portions being attached to the surface of the base heat spreader contact adjacent fins, as shown in FIG. 3b.

In the function of the embodiments of the present invention in FIGS. 1, 2, 3a and 3b heat is applied from an electronic device to the base heat spreader. The base heat spreader minimizes high intensity thermal energy spots and spreads the thermal energy laterally to more evenly distribute the thermal energy to a plurality of fins. This heat is transferred through the base heat spreader into each fin and most immediately is transferred into the liquid transfer medium containing the liquid working fluid at a location on the fin referred to as the evaporator section of the fin. Essentially, the liquid working fluid contained within the liquid transfer medium is the desired heat absorbing element of the fin, and provides for the greatest dissipation of thermal energy from the heat management device. As thermal energy is continually applied to the base heat spreader and thus transferred to the evaporator section of the fins containing the liquid transfer medium and liquid working fluid, the latent heat of vaporization of the working fluid is reached and vapor is generated. Preferably the vapor is generated from the surface layer of the working fluid through evaporation and bubble formation is avoided within the working fluid as bubble formation can lead to the undesirable dry out of the liquid transfer medium.

The only direction or area for the vapor to migrate wherein no liquid coolant is present is the area away from the evaporator section containing the liquid working fluid and liquid transfer medium which is also in a direction away from the heat absorbing area of the fin. Thus, the vapor moves to a lower temperature region within the enclosed area of the fin and subsequently loses its vaporization energy. Otherwise stated, the vapor condenses into liquid at the low temperature region within the enclosed region of the fin. As more and more vapor is condensed, liquid working fluid is collected and moves back into the liquid transfer medium with high wettability characteristics which provide an attraction for the liquid working fluid. As such, the liquid working fluid absorbed back into the liquid transfer medium returns to the evaporator section which is most near the thermal energy communicated from the base heat spreader to the fin. Thus, the liquid working fluid returned to the high temperature region of the fin thereby completing the circulation of the working fluid within the fin of the thermal management device.

The base heat spreader of the current invention can comprise of a variety of materials including metal, alloy, polymer, ceramic, silicon, isotropic synthetic graphite, compressed exfoliated graphite and combinations thereof. One preferred embodiment of the base heat spreader is aluminum which has a thermal conductivity of over 200 W/mK, thus providing for adequate removal of thermal energy from a heat generating source. Aluminum also has a relatively low density making it ideal for applications where the weight of the thermal management device must be kept to a minimum. Furthermore, aluminum is relatively inexpensive and can be easily formed to a variety of shapes by methods including but not limited to extrusion, cutting, forging, casting, or a combination thereof.

In an additional preferred embodiment, the base heat spreader may be comprised of copper which has a thermal conductivity almost twice that of aluminum though has less desirable physical properties than aluminum. Specifically, copper has a higher density, higher bulk cost, and is more restrictive in manufacturing options than is aluminum. However, in applications requiring a thermal management device to remove substantial amounts of thermal energy, copper may be the preferable base spreader for the thermal management device.

In an alternative embodiment, the base heat spreader is comprised of graphite and can be formed of compressed particles of natural graphite, commonly referred to as flexible graphite. A preferred method for manufacturing flexible graphite is described by Shane et al. in U.S. Pat. No. 3,404,061, the disclosure of which is incorporated herein by reference with Norley et al. in U.S. Pat. No. 6,613,252 describing a resin impregnated graphite article and method of manufacturing which is also incorporated herein by reference.

In one embodiment of the practice of the Shane et al. method, natural graphite flakes are intercalated by dispersing the flakes in a solution containing e.g., a mixture of nitric and sulfuric acid, advantageously at a level of about 20 to about 300 parts by weight of intercalate solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

The intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 150 pph and more typically about 50 to about 120 pph. After the flakes are intercalated, any excess solution is drained from the flakes and the flakes are water-washed. Alternatively, the quantity of the intercalation solution may be limited to between about 10 and about 50 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 2 hours, with shorter heating periods, e.g., at least about 10 minutes, for higher temperatures in the above-noted range. Times of one-half hour or less, e.g., on the order of 10 to 25 minutes, can be employed at the higher temperatures.

The above described methods for intercalating and exfoliating graphite flake may beneficially be augmented by a pre-treatment of the graphite flake at graphitization temperatures, i.e. temperatures in the range of about 3000° C. and above and by the inclusion in the intercalant of a lubricious additive.

The pretreatment, or annealing, of the graphite flake results in significantly increased expansion (i.e., increase in expansion volume of up to 300% or greater) when the flake is subsequently subjected to intercalation and exfoliation. Indeed, the increase in expansion is at least about 50%, as compared to similar processing without the annealing step. The temperatures employed for the annealing step should not be significantly below 3000° C., because temperatures even 100° C. lower result in substantially reduced expansion.

The annealing is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station conventionally used for compressing, or "calendering," graphite worms into an integrated graphite article). The resulting article therefore has higher area weight uniformity and greater tensile strength. The lubricious additive is preferably a long chain hydrocarbon, more preferably a hydrocarbon having at least about 10 carbons. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricious additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1200° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into articles that, unlike the original graphite flakes, can be formed and cut into various shapes and provided with small transverse openings by deforming mechanical impact as hereinafter described.

The graphite materials prepared as described are coherent, with good handling strength, and are suitably compressed, e.g. by molding or roll-pressing, to a thickness of about 0.075 mm to 30 mm and a typical density of about 0.1 to 1.5 grams per cubic centimeter (g/cc). From about 1.5-30% by weight of ceramic additives can be blended with the intercalated graphite flakes as described in U.S. Pat. No. 5,902,762 (which is incorporated herein by reference) to provide enhanced resin impregnation in the final graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

As noted above, the graphite materials are also treated with resin and the absorbed resin, after curing, enhances the moisture resistance and handling strength, i.e. stiffness, of the material as well as "fixing" the morphology of the sheet. The amount of resin within the epoxy impregnated graphite articles should be an amount sufficient to ensure that the final cured structure is dense and cohesive, yet the anisotropic thermal conductivity associated with a densified graphite structure is preserved or improved. Suitable resin content is preferably at least about 3% by weight, more preferably about 5 to 35% by weight, and suitably up to about 60% by weight. Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

In a typical resin impregnation step, the flexible graphite material is passed through a vessel and impregnated with the resin system from, e.g. spray nozzles, the resin system advantageously being "pulled through the mat" by means of a vacuum chamber. Typically, but not necessarily, the resin system is solvated to facilitate application into the flexible graphite. The resin is thereafter preferably dried, reducing the tack of the resin and the resin-impregnated article.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into coherent materials and impregnated with resin, as described.

Graphite materials prepared according to the foregoing description can also be generally referred to as compressed particles of exfoliated graphite. Since the materials may be resin-impregnated, in such cases the resin in the sheets needs to be cured before the sheets are used in their intended applications, such as for electronic thermal management.

Following the compression step (such as by calendering), the impregnated materials are cut to suitable-sized pieces and placed in a press, where the resin is cured at an elevated temperature. The temperature should be sufficient to ensure that the lamellar structure is densified at the curing pressure, while the thermal properties of the structure are not adversely impacted. Generally, this will require a temperature of at least about 90° C., and generally up to about 200° C. Most preferably, cure is at a temperature of from about 150° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to densify the structure to the required degree will be utilized. Such a pressure will generally be at least about 7 megapascals (Mpa, equivalent to about 1000 pounds per square inch), and need not be more than about 35 Mpa (equivalent to about 5000 psi), and more commonly from about 7 to about 21 Mpa (1000 to 3000 psi). The curing time may vary depending on the resin system and the temperature and pressure employed, but generally will range from about 0.5 hours to 2 hours. After curing is complete, the composites are seen to have a density of at least about 1.8 g/cm$^3$ and commonly from about 1.8 g/cm$^3$ to 2.0 g/cm$^3$.

Although the formation of sheets through calendering or molding is the most common method of formation of the graphite materials useful in the practice of the present invention, other forming methods can also be employed. For instance, the exfoliated graphite particles can be compression molded into a net shape or near net shape.

Thus, these articles of graphite can be designed in a base heat spreader configuration with the shape or profile molded into the graphite article, either before or after resin impregnation. Cure would then take place in a mold assuming the same shape; indeed, in one embodiment, compression and curing will take place in the same mold. Machining to the final shape can then be effected.

Furthermore, the flexible graphite used as the base heat spreader can be designed to include embossing or other indentations for the fins to communicate with the base heat spreader. By using the flexible graphite as the base heat spreader, the thermal management device can be much more easily designed as flexible graphite is easy to machine and manufacture to a desired configuration to conform to the size and requirements of the electronic device of which thermal energy needs to be management. Yet furthermore, the width as well as thickness of the flexible graphite used as the base heat spreader can be designed in a manner best to accommodate the needs of the electronic device.

While copper or aluminum are the preferred thermally conductive materials for use as the base heat spreader, the use of compressed particles of expanded graphite as the base heat spreader is another option as the thermal conductivity of the graphite base heat spreader is comparable with or better than copper or aluminum but at a fraction of the weight of those materials while also providing significantly greater design flexibility. The graphite base heat spreader takes advantage of the highly directional properties of the graphite to move heat away from the sensitive components of the electronic device. Compared to typical aluminum alloys used for heat management, the graphite sheet used as the base heat spreader can exhibit substantially higher thermal conductivity with values comparable to copper or greater. Furthermore, the graphite article is anisotropic allowing the graphite to channel the heat away more efficiently from the electronic device than both aluminum and copper which are isotropic. The appreciable degree of anisotropy of the graphite based heat spreader is due to the alignment of the graphite particles parallel to the major opposed, parallel surfaces of the material. Thus, the graphite used as the base heat spreader spreads the heat away from the electronic component rather than transporting the heat immediately there through, thus precluding the formation of high intensity thermal energy spots on the opposite side of the base heat spreader while providing the plurality of fins with a relatively even distribution of thermal energy.

The heat spreaders may further include heat pipes embedded within the base heat spreader to better facilitate the dissipation of heat away from the heat source as well as direct the thermal energy into the plurality of fins. The piping contains an additional working fluid which functions as to transfer thermal energy away from the heat source into the surrounding base heat spreader more rapidly and more evenly so that the plurality of fins can better dissipate the heat.

In further embodiments the base heat spreader may be comprised of a vapor chamber rather than a solid thermally conductive metal or graphite material. As such, the use of working fluid within the vapor chamber would function to transfer heat from the side of the vapor chamber base heat spreader in contact with the heat source to the opposite side of the vapor chamber base heat spreader wherein a plurality of fins would assist in more rapidly dissipating the thermal energy.

The plurality of fins in contact with the base heat spreader may include solid heat sink fins comprised of a thermally conductive material such as copper, aluminum, silver, graphite or a combination thereof. The choice of some of the heat sink fins being solid fins rather than fins containing an internal liquid transfer medium and working fluid depends on the specific design constraints of the thermal management device. As the ratio of solid fins to fins containing an internal liquid transfer medium and working fluid is increased for a given thermal management device, the device can typically be create at a lesser cost and decreased weight as solid fins are usually more inexpensive and lighter in weight than fins containing an internal liquid transfer medium structure. Conversely, as the ratio of fins containing an internal liquid transfer medium and working fluid to solid fins comprised of a thermally conductive material is increased for a given thermal management device, the device will provided for improved thermal dissipation as the fins with an internal fins structure are more efficient in dissipating heat.

In one embodiment of the present invention the plurality of fins, and optionally the base heat spreader, may be coated with a high emissivity coating, such as black paint, so as to improve the effectiveness of the thermal management device. In other words, where those surfaces of the plurality of fins and base heat spreader, and optionally including the surface in contact with the heat source are provided with a high emissivity coating, the effective thermal resistance of the heat path from the heat generating source is decreased. By rendering portions of the thermal management device black, including the plurality of fins, the emissivity of the plurality of fins is improved, thereby improving the ability of the thermal management device to radiate heat generated by the heat source.

The working fluid utilized within the enclosed area of the fin for the thermal management device of the present invention functions as to absorb heat by evaporation of the liquid phase of the working fluid in higher temperature region of the enclosed area of the fin which is adjacent to the base heat spreader. The thermal energy is thus transported via the vaporized working fluid to a lower temperature region of the enclosed area of the fin wherein the thermal energy is removed by condensation at this lower temperature region. Essentially, this process makes use of the working fluid's latent heat of vaporization/condensation allowing for the transfer of a relatively large amount of thermal energy despite the use of only a small amount of fluid within the enclosed area of the fins of the present invention.

Furthermore, a variety of fluids may be used as the working fluid within the fins of the present invention. Working fluids may be selected from the group comprising water, alcohol, ketones, acetone, methanol, ethanol, toluene, chlorofluorocarbon-type coolants, ammonia, freons, cryogenic fluids, liquid metals, and combinations thereof. Preferably, the liquid working fluid of the present invention is water. Not only is water preferable to use in consideration of environmental concerns, but water is generally compatible with the other components of the present invention. Furthermore, the use of water as the working fluid also provides for greater simplicity in designing the liquid transfer medium's structure.

The preferred liquid transfer medium for incorporation into the enclosed area within the fin is a wick which is described by Kim et al. in International Application No. WO 2006/073269 which is herein incorporated by reference. In one embodiment of Kim et al., the liquid transfer medium is defined as a structure constructed of a material being capable of absorbing and holding working fluid such as water and is typically an aggregation of fine fibers. As embodied in the present application, the liquid transfer medium has good wettability characteristics, which is understood to be defined as having an affinity for liquids or being highly absorbent of multiple liquid types.

By using an liquid transfer medium with good wettability characteristics, working fluid such as water can permeate into the structure of the liquid transfer medium in a very short time and can remain in the structure as liquid working fluid. Furthermore, the fibers of the liquid transfer medium utilized within the enclosed area of the fin can have groups such as —OH, —COOH, =O, —NH2, —NH—, =N—, etc. on the surface thereof so that the liquid transfer medium structure can easily bond to liquids such as water at the molecular level.

Furthermore, the fiber from which the liquid transfer medium is formed may be designed within the liquid transfer medium to have hollow interior areas or other structural designs internally so that capillary force causes water to be held within the interior regions of the fiber of the liquid transfer medium. Thus, the fibers of the liquid transfer medium may have a variety of shapes and may be constructed of absorbent filaments including a polyester filament for use in the present invention.

Additionally, the liquid transfer medium may have a surface treatment including grooves, channels, or different indentations so that the liquid transfer medium has a high capacity to absorb and hold water through capillary force or other means including adhesion or cohesion.

In an additional embodiment of the liquid transfer medium structure utilized in the enclosed area of the fins of the present invention, carbon nanotubes may form at least a portion of the liquid transfer medium's structure. A benefit of the carbon nanotubes for use as the liquid transfer medium is that carbon nanotubes have large surface areas, substantial pores, the nanotubes are very lightweight, and can hold a significant amount of liquid working fluid preferably being water.

Additional embodiments of the liquid transfer medium can include materials such as foams, porous materials including ceramic, polymers, and cellulosic materials, sintered copper, and other materials capable of maintaining a working fluid.

The liquid transfer medium utilized in the thermal management device of the present invention afford the capabilities of providing working fluid to an area most near the base heat spreader. This positioning of the working fluid at the evaporator section of the fin puts the working fluid in the location for potentially the greatest absorption of thermal energy from the base heat spreader. Thus, the working fluid within the liquid transfer medium is at the best location for absorbing thermal energy from the base heat spreader which is received from the electronic device wherein the working fluid can more readily dissipate the thermal energy through its latent heat of vaporization within the enclosed area of the fin. Furthermore, by use of the liquid transfer medium having good wettability characteristics, the fin structures of the present thermal management system have the advantage of avoiding dry out of the working fluid.

Thermal epoxy may also be utilized to adhere the plurality of fins to the surface of the base heat spreader. The epoxy may include carbonaceous elements or metallic elements so as to provide for improved thermal conduction from the base heat spreader into the plurality of fins. Furthermore, the epoxy may include a variety of resins both phenolic and polymeric resins as well as ceramic articles and combinations thereof.

A further embodiment of attaching the plurality of fins to the surface of the base heat spreader can include swaging as described by Lipinski in U.S. Pat. No. 5,406,698, the disclosure of which is incorporated herein by reference. Generally, a secure connection is made between the plurality of fins and the base heat spreader through the use of vertical and lateral pressure without the use of an epoxy.

An additional embodiment includes the use of solder to secure the plurality of fins in contact with the base heat spreader so that thermal energy flows from the base heat spreader to the plurality of fins. Soldering is a preferred method of attachment as soldering provides superior bond strength as well as thermal contact at the connection point between the fin and the base heat spreader. One method of soldering includes applying paste in a stencil formation wherein the paste is applied through a stencil, the stencil is removed, the fins are applied, and the solder is cured. Typical solder includes but is not limited to a lead-tin mixture for bonding the fins. Soldering is preferred over epoxy as soldering utilizes a paste comprised primary of two metallic elements, which have a relatively high thermal conductivity, whereas epoxies are often comprised of non-metallic materials resulting in a bond having a lower thermal conductivity. Essentially, the solder creates a true metallurgical bond between the base heat spreader and fins thus enhancing the transfer of thermal energy from the base heat spreader to the fins.

A further means of attachment includes brazing in which a molten filler metal is used to join the fins to the base heat spreader through capillary attraction. Typically aluminum or copper are used for brazing wherein high temperatures are utilized to fill the space between the contact point of the base heat spreader and the fin.

Consequently, the thermal management device of the present invention is designed so that liquid working fluid contained within the liquid transfer medium in evaporator section of the fin, absorbs thermal energy and turns into gas within this high thermal energy area of the fin. The vapor then migrates to lower temperature regions of the fin and thus condenses back into liquid working fluid which flows through capillary force back into the liquid transfer medium having good wettability characteristics. Thus, the amount of working fluid which was converted into vapor is converted back into liquid working fluid thus compensating the amount of liquid working fluid present evaporated from the liquid transfer medium. Thus, the working fluid circulates between liquid phase and vapor phase and by doing so, provides for a method of dissipating thermal energy through the latent heat of vaporization of the working fluid.

Accordingly by the practice of the present invention, thermal management devices having heretofore unrecognized characteristics are prepared. The thermal management devices exhibit a much improved reduction of localized hot spots as well as an improved distribution of thermal energy into a plurality of fins having an liquid transfer medium structure with good wettability containing working fluid for the dissipation of thermal energy from an electronic device.

The disclosures of all cited patents and publications referred to in this application are incorporated herein by reference.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A heat sink comprising:
   a) a base heat spreader;
   b) at least one fin including:
      b1) a housing which encloses an inner area,
      b2) a liquid transfer medium within the inner area of the housing;
      b3) a working fluid within the inner area of the housing and at least partially contained in the liquid transfer medium; and
      b4) at least one support structure within the housing, for separating the liquid transfer medium into two portions; and
   c) a contact point between the base heat spreader and the at least one fin;
   wherein the heat spreader can transfer thermal energy into the housing of the at least one fin such that liquid working fluid in the liquid transfer medium is evaporated to vapor working fluid and mobilized to a relatively low temperature region of inner housing of the fin causing the vapor working fluid to condense back into liquid working fluid and flow to the liquid transfer medium.

2. The heat sink of claim 1 further comprising thermal adhesive between the base heat spreader and at least one fin.

3. The heat sink of claim 1 further comprising solder between the base heat spreader and at least one fin.

4. The heat sink of claim 1 further comprising a mechanic crimp between the base heat spreader and at least one fin.

5. The heat sink of claim 1 further comprising an L-shape fitting between the base heat spreader and at least one fin.

6. The heat sink of claim 1 wherein the base heat spreader is selected from the group consisting of graphite, metal, alloy, polymer, ceramic, silicon and combinations thereof.

7. The heat sink of claim 1 wherein the base heat spreader is copper.

8. The heat sink of claim 1 wherein the base heat spreader is aluminum.

9. The heat sink of claim 1 wherein the base heat spreader is a vapor chamber.

10. The heat sink of claim 1 wherein the base heat spreader is a graphite article.

11. The heat sink of claim 1 wherein the housing is selected from the group consisting of a metal, metal alloy, ceramic material, semiconductor material, polymer, and combinations thereof.

12. The heat sink of claim 1 wherein the housing is copper.

13. The heat sink of claim 1 wherein the working fluid is water.

14. The heat sink of claim 1 wherein the working fluid is selected from the group consisting of water, alcohol, ketones, CFC-type coolant, and combinations thereof.

15. The heat sink of claim 1 wherein the liquid transfer medium has an affinity for liquids.

16. The heat sink of claim 15 wherein the liquid transfer medium comprises compounds selected from the group consisting of —OH, —COOH, =O, —NH2, —NH—, =N— and combinations thereof.

17. The heat sink of claim 15 wherein the liquid transfer medium is comprised of carbon nanotubes.

18. The heat sink of claim 15 wherein the liquid transfer medium has a physical surface design to increase the liquid transfer medium's capacity to absorb liquids.

19. The heat sink of claim 15 wherein the liquid transfer medium has an internal structural design to increase the liquid transfer medium's capacity to absorb liquids.

20. The heat sink of claim 1 wherein the support structure provides physical support to the liquid transfer medium.

21. The heat sink of claim 1 wherein the support structure is comprised of a material selected from the group consisting of metal, alloy, polymer, ceramic, and combinations thereof.

22. The heat sink of claim 1 wherein the support structure is copper.

23. The heat sink of claim 1 wherein the support structure extends at least partially on two surfaces of the liquid transfer medium.

24. The heat sink of claim 1 wherein the support structure extends at least partially between two portions of the liquid transfer medium.

25. The heat sink of claim 1 further comprising solid fins.

26. The heat sink of claim 25 wherein the solid fins are copper.

27. The heat sink of claim 25 wherein the solid fins are aluminum.

28. The heat sink of claim 1 further comprising a black layer on at least one surface of the fins and base heat spreader.

29. The heat sink of claim 28 wherein the black layer is black paint.

30. The heat sink of claim 1 wherein the liquid working fluid flows by capillary force.

* * * * *